United States Patent
Sung

(10) Patent No.: US 8,927,309 B2
(45) Date of Patent: Jan. 6, 2015

(54) METHOD FOR PRODUCING ORGANIC LIGHT-EMITTING DIODE ILLUMINATING DEVICE

(71) Applicant: Ultimate Image Corporation, Miaoli (TW)

(72) Inventor: Chih-Feng Sung, Miaoli (TW)

(73) Assignee: Ultimate Image Corporation, Miaoli (TW)

( * ) Notice: Subject to any disclaimer, the term of this patent is extended or adjusted under 35 U.S.C. 154(b) by 0 days.

(21) Appl. No.: 14/054,887

(22) Filed: Oct. 16, 2013

(65) Prior Publication Data
US 2014/0120644 A1    May 1, 2014

(30) Foreign Application Priority Data
Oct. 26, 2012    (TW) .............................. 101139755 A

(51) Int. Cl.
| | | |
|---|---|---|
| H01L 21/66 | (2006.01) | |
| G01R 31/26 | (2014.01) | |
| H01L 51/40 | (2006.01) | |
| H01L 29/08 | (2006.01) | |
| H01L 35/24 | (2006.01) | |
| H01L 51/00 | (2006.01) | |
| H01L 27/32 | (2006.01) | |

(52) U.S. Cl.
CPC ............ *H01L 22/22* (2013.01); *H01L 27/3202* (2013.01); *H01L 2251/5361* (2013.01); *H01L 2251/568* (2013.01)

USPC ........... 438/34; 438/99; 257/40; 257/E51.018

(58) Field of Classification Search
USPC ............ 438/34, 82, 99, 562, 487; 257/40, 72, 257/57, 59, 66, 88, 291–294, 347, E51.001, 257/E51.018, E51.026; 315/169.3
See application file for complete search history.

(56) References Cited

U.S. PATENT DOCUMENTS

| 6,583,576 | B2 * | 6/2003 | Koyama ...................... 315/169.2 |
| 6,590,335 | B1 * | 7/2003 | Nagayama .................... 313/506 |
| 6,747,728 | B2 * | 6/2004 | Nagayama .................... 349/192 |
| 7,148,509 | B2 * | 12/2006 | Kim et al. ........................ 257/72 |
| 7,378,124 | B2 * | 5/2008 | Daniels .......................... 427/66 |
| 7,947,985 | B2 * | 5/2011 | Kim et al. ........................ 257/72 |
| 8,587,501 | B2 * | 11/2013 | White et al. ..................... 345/81 |
| 2009/0079670 | A1 * | 3/2009 | Sempel ............................. 345/45 |
| 2010/0283042 | A1 * | 11/2010 | Katz et al. ....................... 257/40 |

\* cited by examiner

*Primary Examiner* — Evan Pert
*Assistant Examiner* — Gustavo Ramallo
(74) *Attorney, Agent, or Firm* — Trop Pruner & Hu, P.C.

(57) ABSTRACT

A method for producing an OLED illuminating device includes steps of: (a) forming metal lines and power transmission lines on a substrate; (b) forming a patterned insulating layer to cover the metal lines and the power transmission lines; (c) forming a patterned first electrode layer on the insulating layer; (d) forming an organic light-emitting membrane structure on the first electrode layer; (e) forming a second electrode layer on the organic light-emitting membrane structure so that a plurality of luminescent pixels are formed; and (f) when one of the luminescent pixels is defective, cutting one of the power transmission lines that is connected to the defective one of the luminescent pixels using an energy beam.

9 Claims, 10 Drawing Sheets

METHOD FOR PRODUCING ORGANIC LIGHT-EMITTING DIODE ILLUMINATING DEVICE

CROSS-REFERENCE TO RELATED APPLICATION

This application claims priority of Taiwanese Application No. 101139755, filed on Oct. 26, 2012.

BACKGROUND OF THE INVENTION

1. Field of the Invention

The invention relates to a method for producing an illuminating device, more particularly to a method for producing an organic light-emitting diode (OLED) illuminating device.

2. Description of the Related Art

When producing a conventional OLED illuminating device, particles existing in the clean room may easily cause defects in the conventional OLED illuminating device and usually result in short-circuit between anodes and cathodes, thereby arising in damages to the conventional OLED illuminating device. Therefore, those who have ordinary skill in the art usually adopt a laser beam to burn out those defective portions in the conventional OLED illuminating devices as disclosed in U.S. Pat. No. 6,590,335 B1 and No. 6,747,728 B2.

However, the high-energy laser beam may cause damage to an organic light-emitting layer, and the anodes and the cathodes may still contact each other, such that the short-circuit may not be resolved. Besides, by using the conventional methods in the two US patents, burnt residues may fly in the air and fall on the OLED illuminating device to cause another short-circuit therein, thereby adversely affecting production yield for the OLED illuminating device. Therefore, there is a need in the art to provide a solution for improving the production yield when producing an OLED illuminating device.

SUMMARY OF THE INVENTION

Therefore, the object of the present invention is to provide a method that may alleviate the aforementioned drawbacks of the prior art.

Accordingly, a method for producing an OLED illuminating device of the present invention comprises the steps of:

(a) forming a plurality of metal lines and a plurality of groups of power transmission lines on a substrate, the metal lines being disposed separately in a first direction and extending along a second direction that is substantially perpendicular to the first direction, the power transmission lines in each of the groups being disposed separately in the second direction and extending from a corresponding one of the metal lines along the first direction, each of the power transmission lines in each of the groups having a first end portion electrically coupled to a corresponding one of the metal lines;

(b) forming a patterned insulating layer to cover the metal lines and the groups of the power transmission lines, the patterned insulating layer being formed with a plurality of via holes each of which corresponds in position to a respective one of the transmission lines and exposes a second end portion of the respective one of the transmission lines that is away from the first end portion;

(c) forming a patterned first electrode layer on the patterned insulating layer, the patterned first electrode layer including a plurality of electrode portions each of which corresponds in position to and extends into a respective one of the via holes, and electrically couples to a respective one of the power transmission lines;

(d) forming an organic light-emitting membrane structure on the patterned first electrode layer;

(e) forming a second electrode layer on the organic light-emitting membrane structure so that the electrode portions, the organic light-emitting membrane structure and the second electrode layer cooperatively form a plurality of luminescent pixels that are electrically coupled to the metal lines through the power transmission lines; and (f) when one of the luminescent pixels is defective, cutting one of the power transmission lines that is connected to the defective one of the luminescent pixels using an energy beam to electrically disconnect the electrode portion of the defective one of the luminescent pixels from the corresponding one of the metal lines.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Referring to FIGS. 1 to 10, the preferred embodiment of a method for producing an OLED illuminating device according to the present invention includes the following steps.

Figure 1:
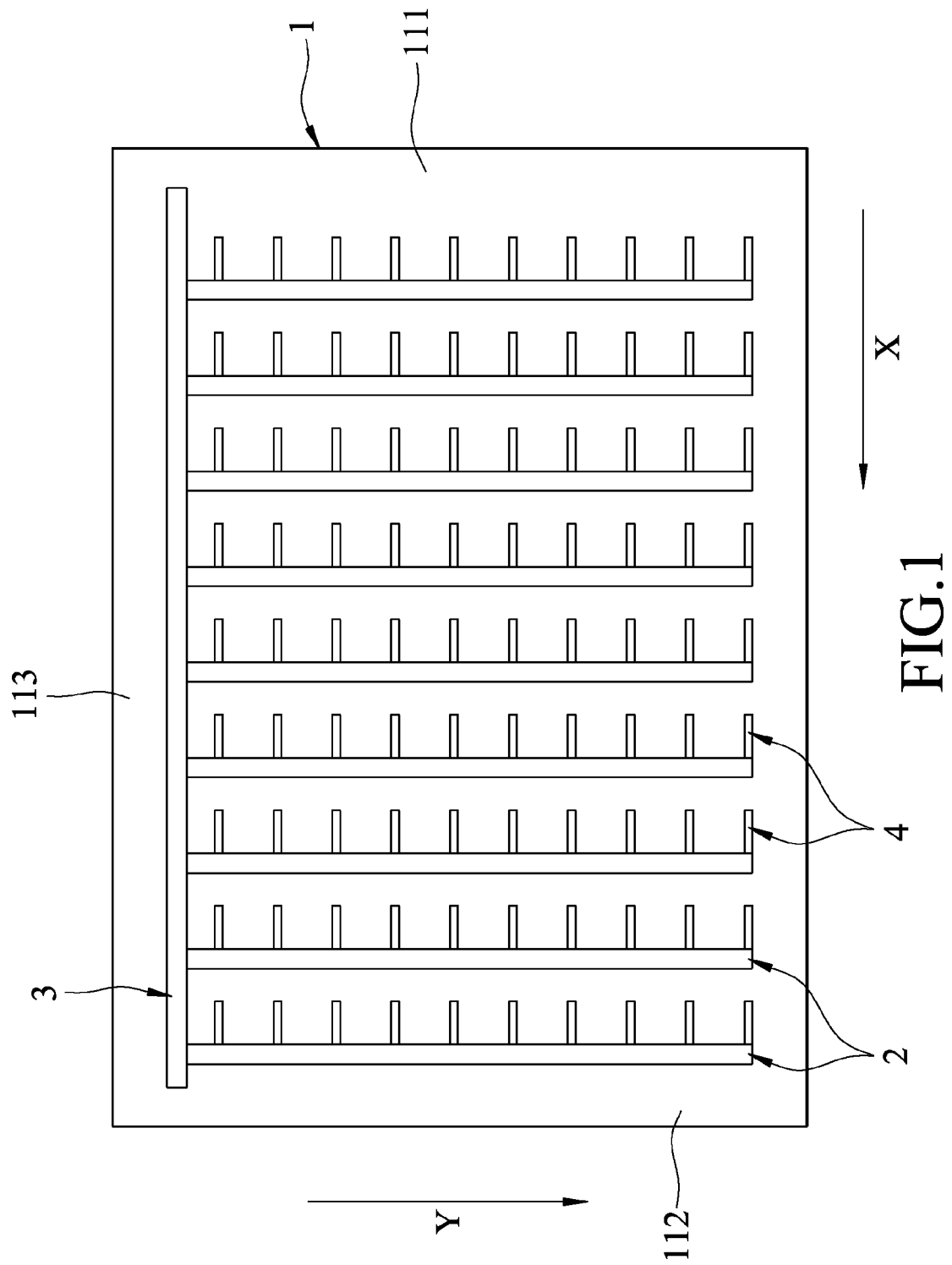
FIG. 1 is a schematic top view of the preferred embodiment at a step (a) of a method for producing an OLED illuminating device according to the present invention.
Figure 2:
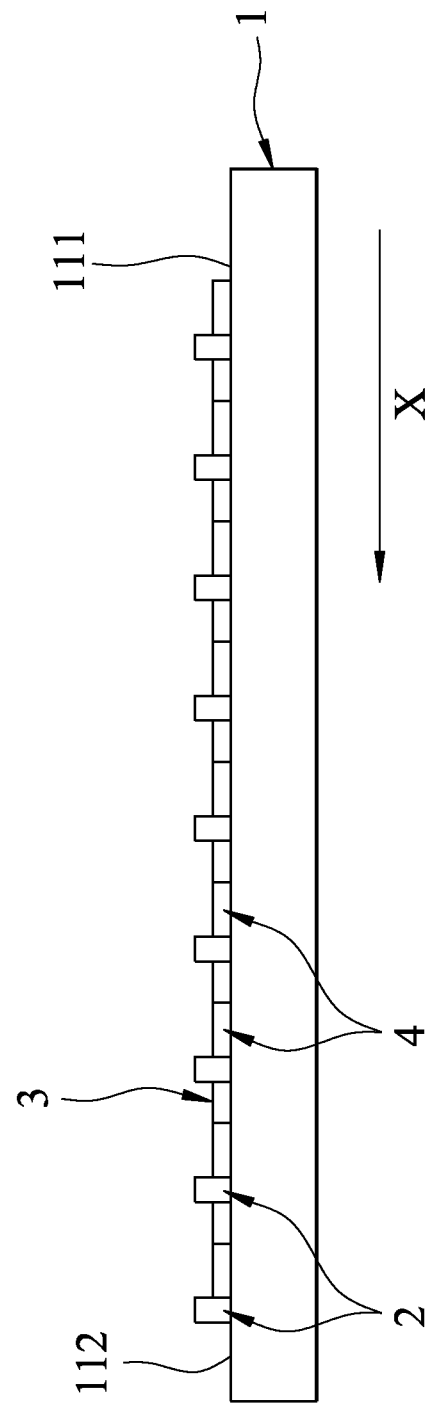
FIG. 2 is a schematic side view of the preferred embodiment at the step (a)

Step (a): forming a plurality of metal lines 2, a bus line 3, and a plurality of groups of power transmission lines 4 on a substrate 1. As shown in FIGS. 1 and 2, the substrate 1 has a first side portion 111, a second side portion 112 opposite to the first side portion 111 in a first direction (X), and a third side portion 113 interconnecting the first and second side portions 111, 112. The metal lines 2 are disposed separately in the first direction (X) and extend parallel along a second direction (Y) that is substantially perpendicular to the first direction (X). The power transmission lines 4 in each of the groups are disposed separately in the second direction (Y) and extend from a corresponding one of the metal lines 2 along the first direction (X). Each of the power transmission lines 4 in each of the groups has a first end portion that is electrically coupled to a corresponding one of the metal lines 2. In this embodiment, the bus line 3 is formed on the third side portion 113 of the substrate 1 and extends in the first direction (X) for interconnecting the metal lines 2, and has one end bonded to a flexible printed circuit board (not shown), which is electrically coupled to a power source (not shown), thereby equipotentially introducing an input current into each of the metal lines 2.

Preferably, the power transmission lines 4 in each of the groups are spaced apart equidistantly in the second direction (Y).

Preferably, each of the metal lines 2 is made of a metallic material selected from the group consisting of molybdenum, aluminum titanium, tantalum, chromium, copper, silver, and combinations thereof.

Preferably, each of the power transmission lines 4 is made of a metallic material or a conductive metal oxide material. The metallic material is selected from the group consisting of molybdenum, aluminum, titanium, tantalum, chromium, copper, silver, and combinations thereof. The conductive metal oxide material is selected from the group consisting of indium oxide ($In_2O_2$), tin oxide ($SnO_2$), zinc oxide (ZnO), indium tin oxide (ITO), indium zinc oxide (IZO), aluminum-doped zinc oxide (ZnO:Al), gallium-doped zinc oxide (ZnO:Ga) and combinations thereof.

Figure 3:
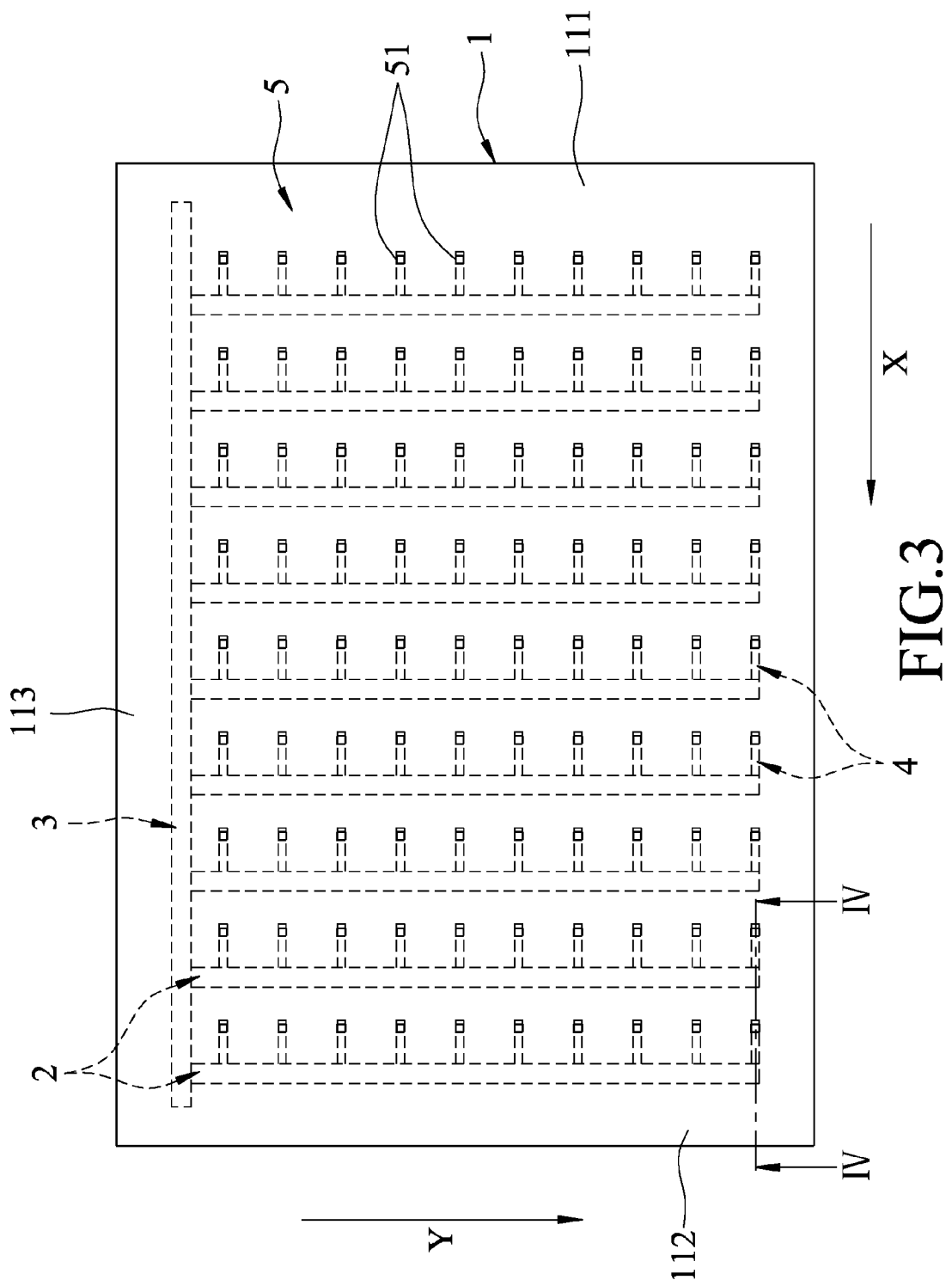
FIG. 3 is a schematic top view of the preferred embodiment at a step (b) of the method.
Figure 4:
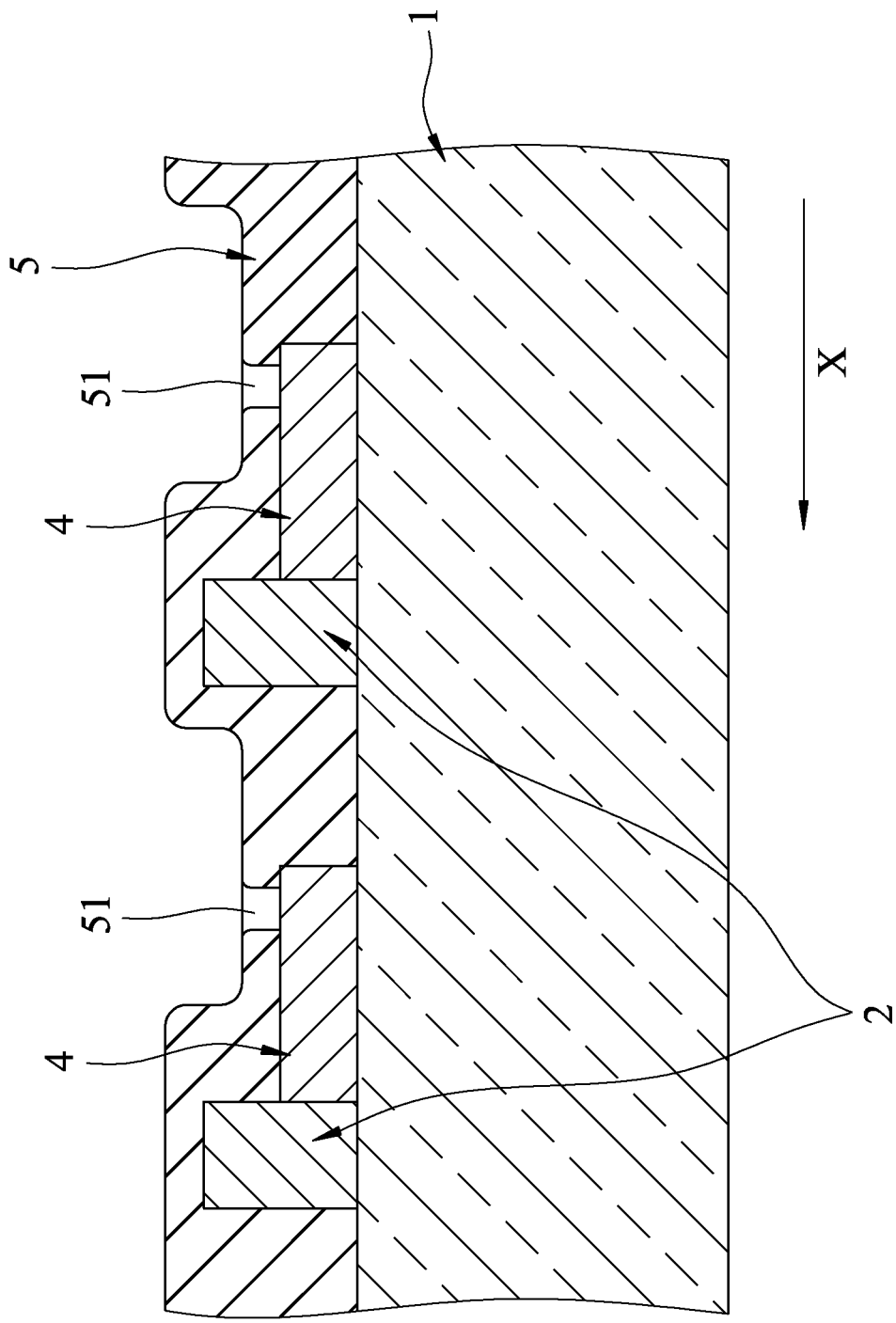
FIG. 4 is a fragmentary schematic sectional view of the preferred embodiment taken along line IV-IV in FIG. 3.

Step (b): forming a patterned insulating layer 5 to cover the metal lines 2 and the groups of the power transmission lines 4. As shown in FIGS. 3 and 4, the patterned insulating layer 5 is formed with a plurality of via holes 51 each of which corresponds in position to a respective one of the power transmission lines 4 and exposes a second end portion of the respective one of the power transmission lines 4 that is away from the first end portion. Preferably, the patterned insulating layer 5 is made of an inorganic material or an organic material. In the case of the organic material, the patterned insulating layer 5 is formed by physical vapor deposition and the organic material has a relatively high melting temperature. Preferably, the patterned insulating layer 5 has a transmission rate of greater than 80%.

Figure 5:
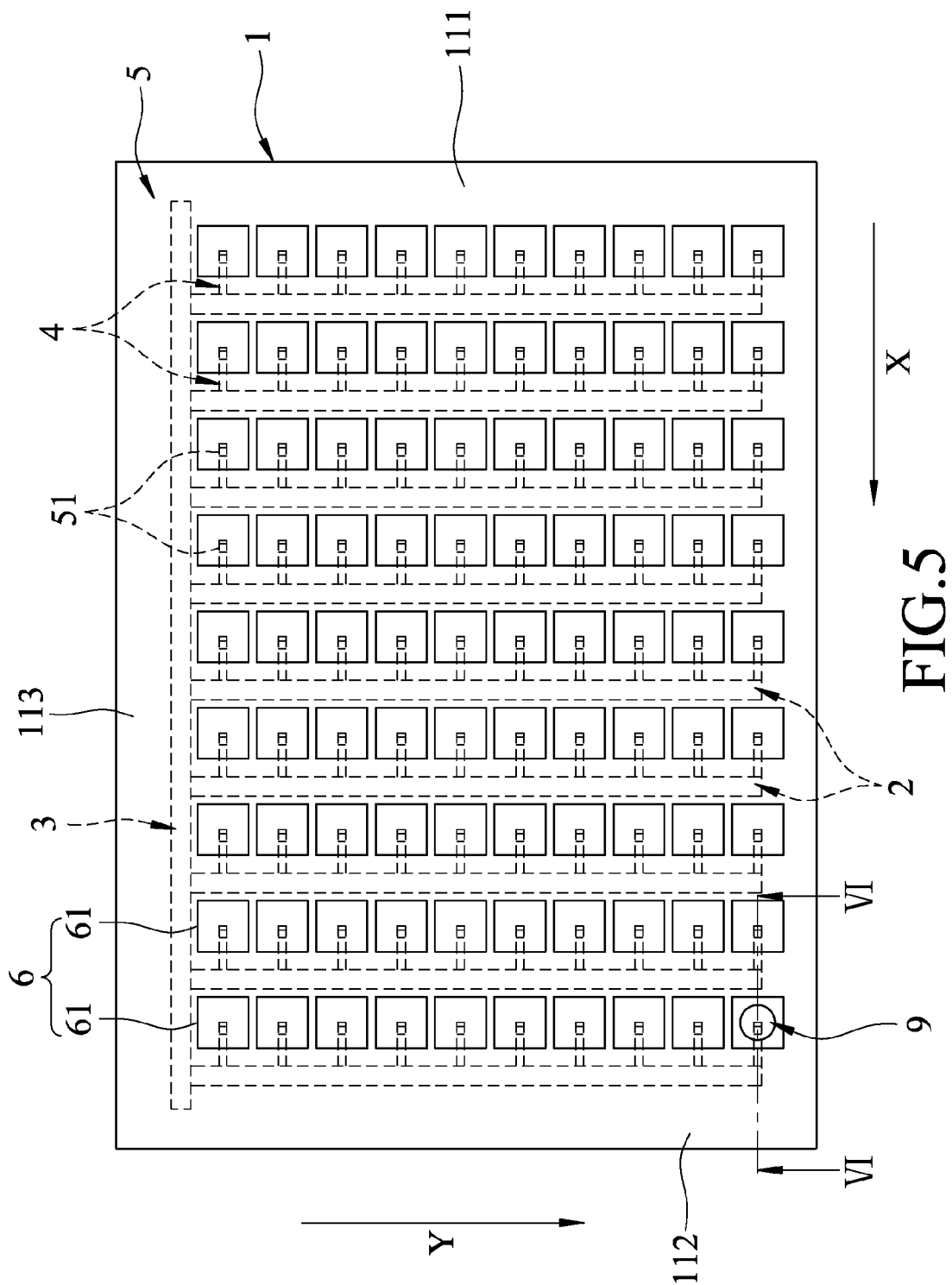
FIG. 5 is a schematic top view of the preferred embodiment at a step (c) of the method.
Figure 6:
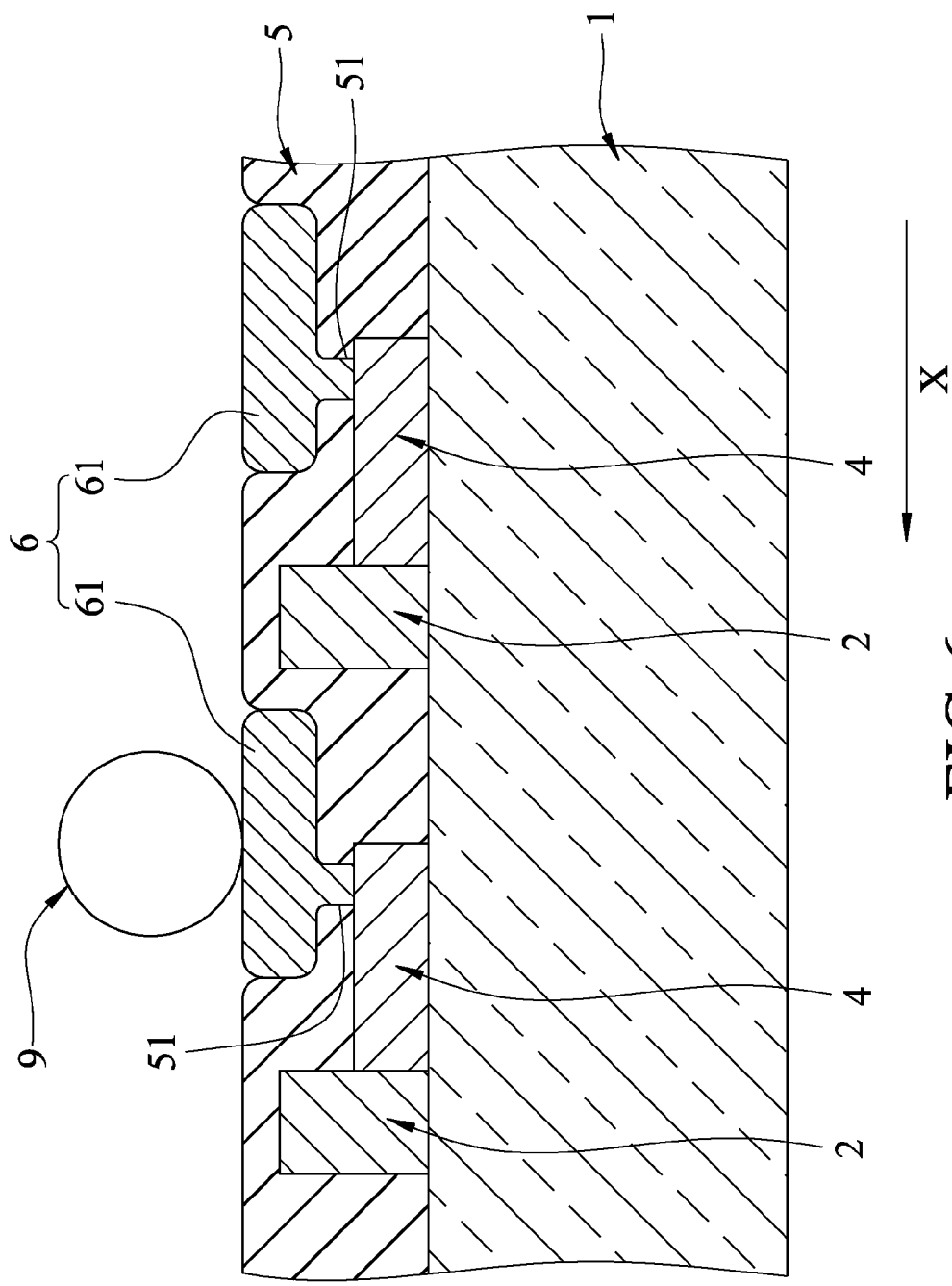
FIG. 6 is a fragmentary schematic sectional view of the preferred embodiment taken along line VI-VI in FIG. 5.

Step (c): forming a patterned first electrode layer 6 on the patterned insulating layer 5. As shown in FIGS. 5 and 6, the patterned first electrode layer 6 includes a plurality of electrode portions 61 each of which corresponds in position to and extends into a respective one of the via holes 51 and electrically couples to a respective one of the power transmission lines 4. In this embodiment, each of the electrode portions 61 of the patterned first electrode layer 6 is configured in a square shape and has a length ranging from 100 μm to 300 μm.

Figure 7:
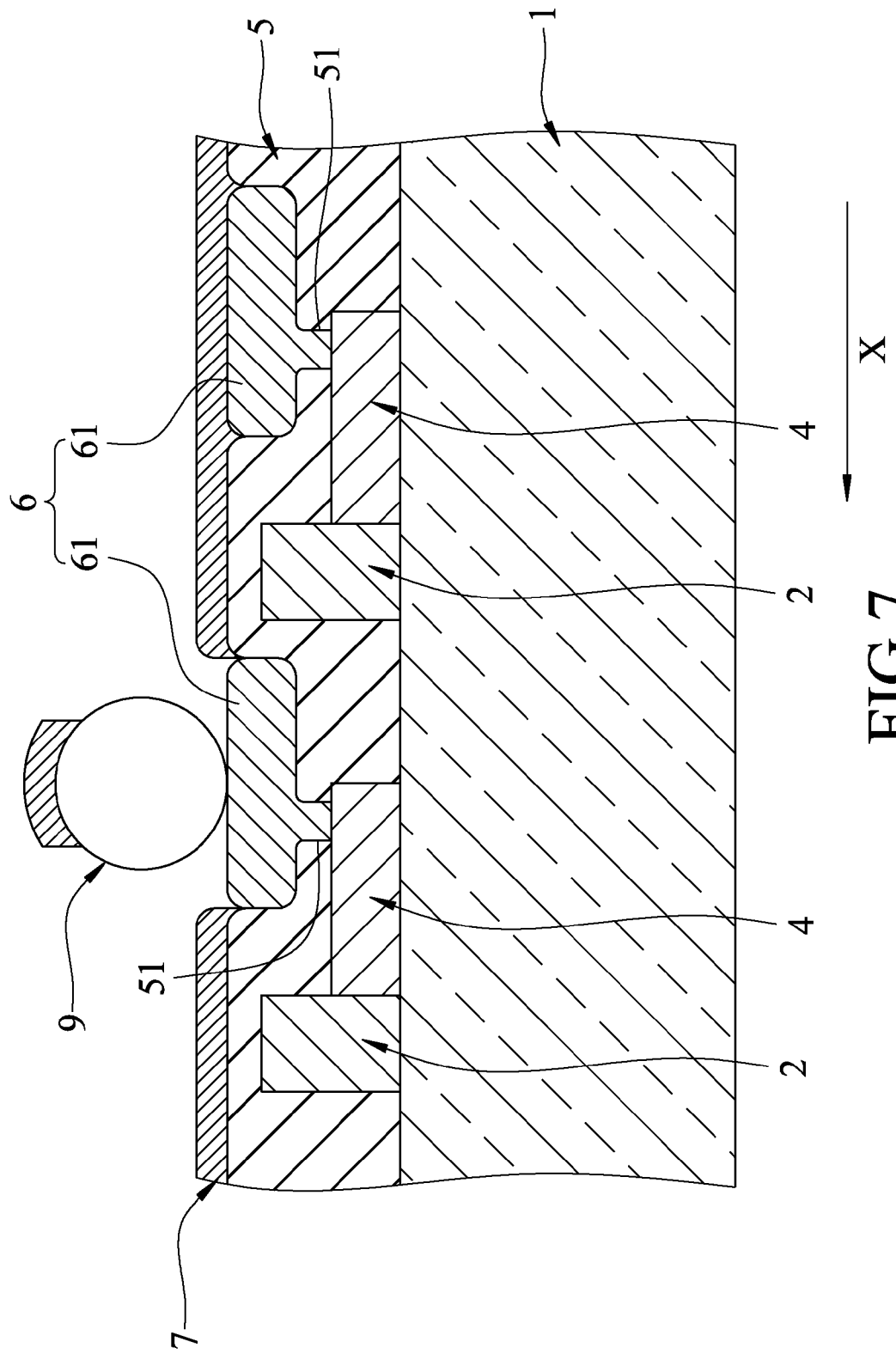
FIG. 7 is a fragmentary schematic sectional view of the preferred embodiment at a step (d) of the method.
Figure 8:
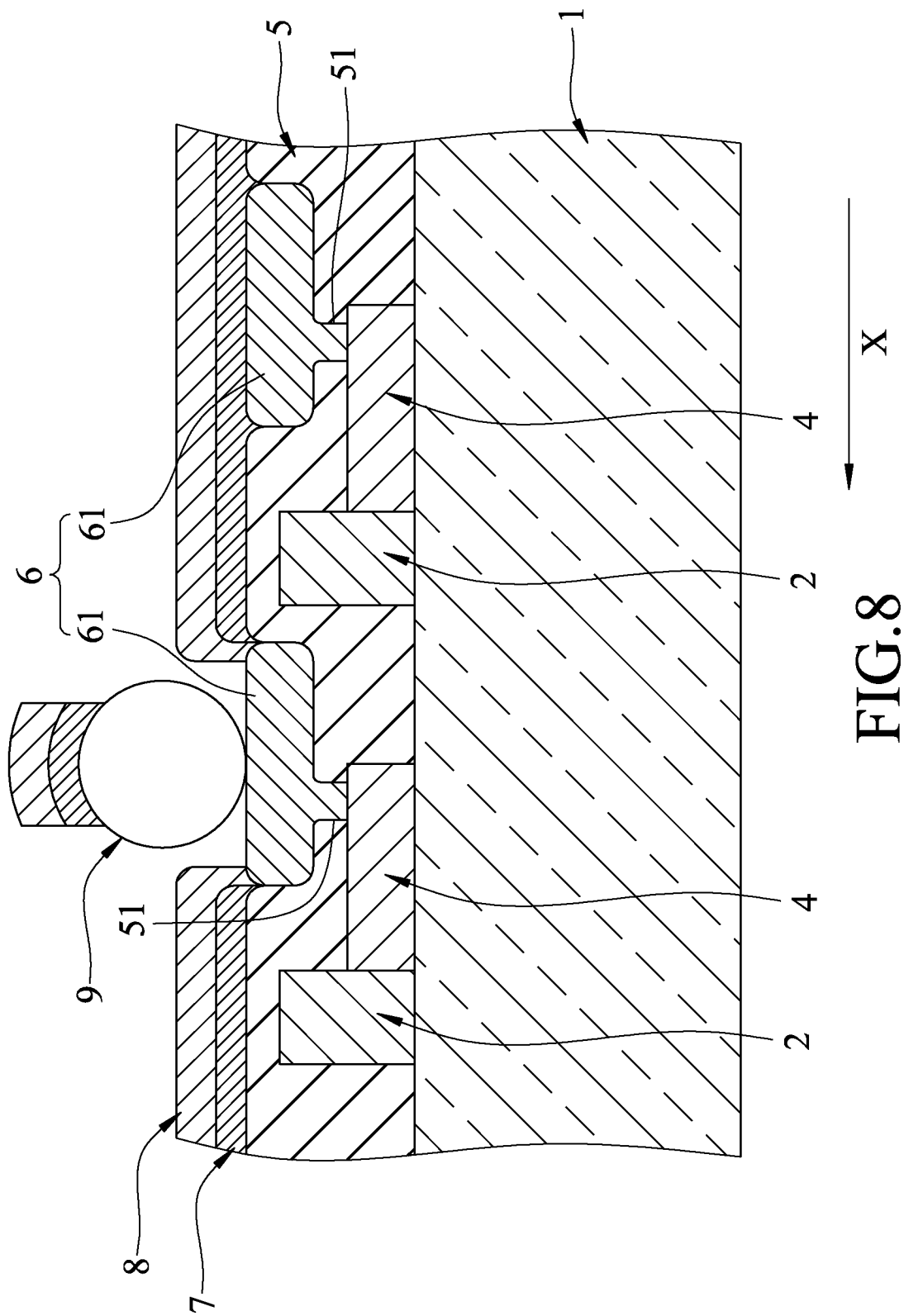
FIG. 8 is a fragmentary schematic sectional view of the preferred embodiment at a step (e) of the method.
Figure 9:
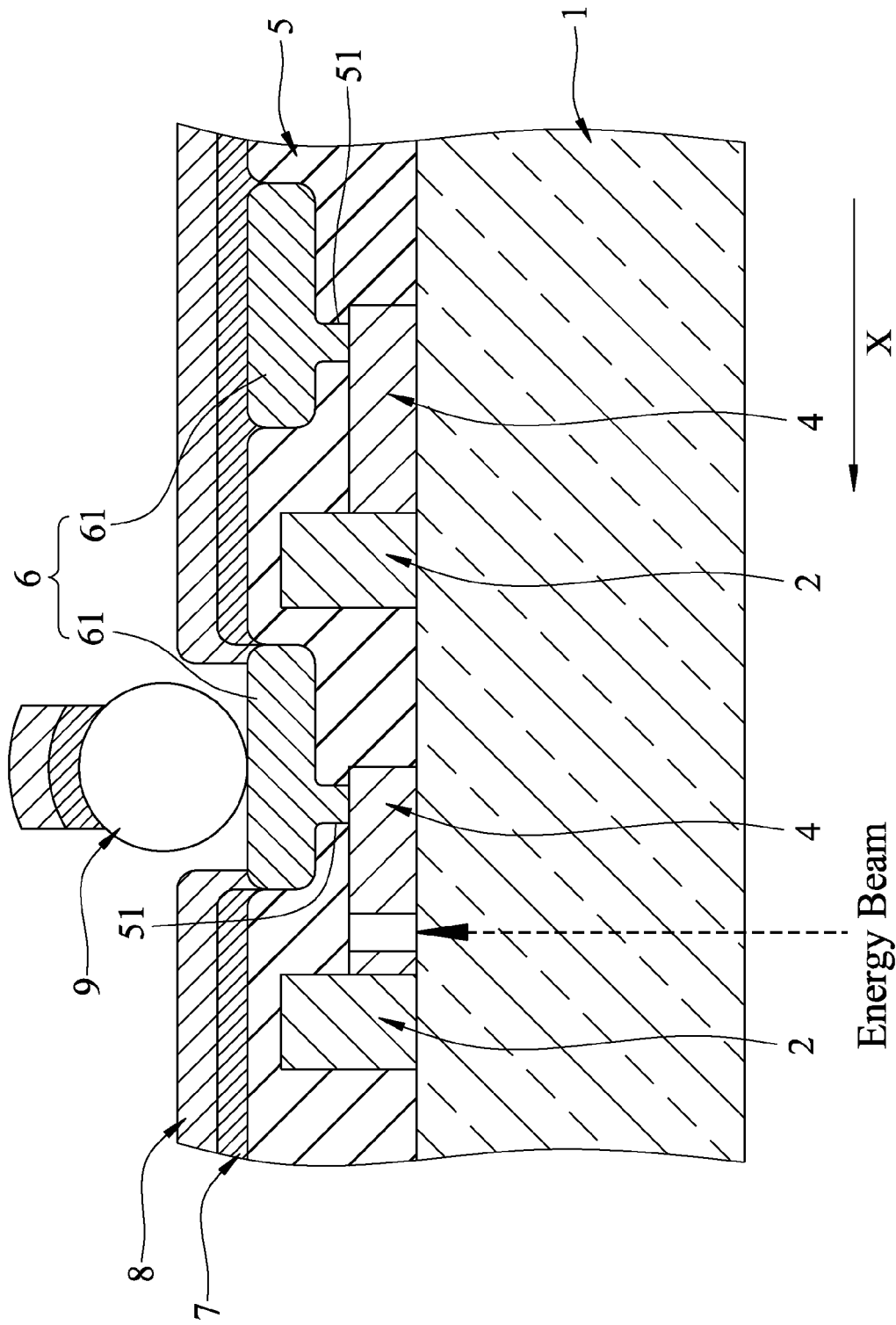
FIG. 9 is a fragmentary schematic sectional view of the preferred embodiment at a step (f) of the method.
Figure 10:
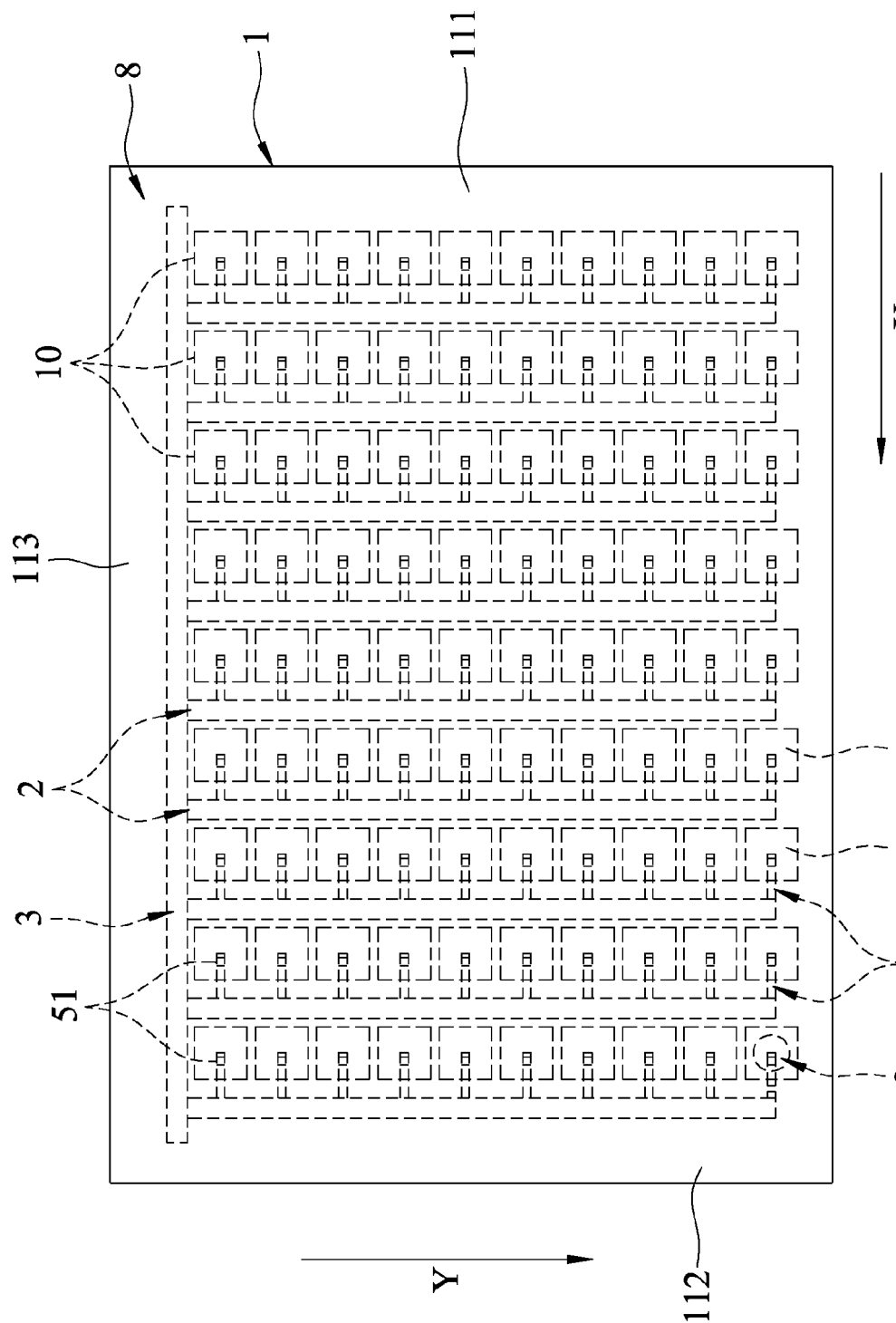
FIG. 10 is a schematic top view of the preferred embodiment of the OLED illuminating device produced by the method.

Step (d): forming an organic light-emitting membrane structure 7 on the patterned first electrode layer 6 as shown in FIG. 7. The organic light-emitting membrane structure 7 includes a hole injection layer, a hole transfer layer, an organic emissive layer, an electron transfer layer, and an electron injection layer sequentially stacked on the patterned first electrode layer 6. Since the feature of the present invention does not reside in the structure of the organic light-emitting membrane structure 7, details thereof are omitted herein for the sake of brevity.

Step (e): forming a second electrode layer 8 on the organic light-emitting membrane structure 7 (see FIG. 8), so that the electrode portions 61 of the patterned first electrode layer 6, the organic light-emitting membrane structure 7, and the second electrode layer 8 cooperatively form a plurality of luminescent pixels 10 (see FIG. 10) that are electrically coupled to the metal lines 2 through the power transmission lines 4, respectively. In this embodiment, the second electrode layer 8, which serves as a cathode, is electrically insulated from the patterned first electrode layer 6, which serves as an anode, by the organic light-emitting membrane structure 7.

Step (f): when one of the luminescent pixels 10 is defective due to presence of a particle 9 on a corresponding one of the electrode portions 61 (see FIGS. 9 and 10), cutting one of the power transmission lines 4 that is electrically coupled to the defective one of the luminescent pixels 10 using an energy beam (e.g., a laser beam) to electrically disconnect the electrode portion 61 of the defective one of the luminescent pixels 10 from the corresponding one of the metal lines 2.

As an example, the defective one of the luminescent pixels 10 is caused by the particle 9 deposited on the corresponding electrode portion 61 prior to the Step (d), such that the latter-formed organic light-emitting membrane structure 7 cannot sufficiently cover the patterned first electrode layer 6, and which allows the latter-formed second electrode layer 8 to electrically contact the patterned first electrode layer 6, thereby causing short-circuit of the defective one of the luminescent pixels 10.

It is worth noting that each of the power transmission lines 4 has a width in the second direction (Y), and the width is preferably smaller than half of a length of the electrode portions 61 in the second direction (Y) so as to avoid causing damage to other luminescent pixels 10 proximate to the defective luminescent pixels 10.

In this preferred embodiment, the laser beam irradiation is performed from the side of the substrate 1.

By using the energy beam to cut the respective one of the power transmission lines 4 and to disconnect the defective one of the luminescent pixels 10 from the respective one of the metal lines 2, damage to the organic light-emitting membrane structure 7 can be prevented by the presence of the patterned insulating layer 5, and the particle 9 can be retained within the defective one of the luminescent pixels 10, so as to improve the production yield and manufacturing efficiency.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A method for producing an organic light-emitting diode (OLED) illuminating device, comprising the steps of:
   (a) forming a plurality of metal lines and a plurality of groups of power transmission lines on a substrate, the metal lines being disposed separately in a first direction and extending along a second direction that is substantially perpendicular to the first direction, the power transmission lines in each of the groups being disposed separately in the second direction and extending from a corresponding one of the metal lines along the first direction, each of the power transmission lines in each of the groups having a first end portion electrically coupled to a corresponding one of the metal lines;
   (b) forming a patterned insulating layer to cover the metal lines and the groups of the power transmission lines, the patterned insulating layer being formed with a plurality of via holes each of which corresponds in position to a respective one of the transmission lines and exposes a second end portion of the respective one of the transmission lines that is away from the first end portion;
   (c) forming a patterned first electrode layer on the patterned insulating layer, the patterned first electrode layer including a plurality of electrode portions each of which corresponds in position to and extends into a respective one of the via holes, and electrically couples to a respective one of the power transmission lines;
(d) forming an organic light-emitting membrane structure on the patterned first electrode layer;
(e) forming a second electrode layer on the organic light-emitting membrane structure so that the electrode portions, the organic light-emitting membrane structure and the second electrode layer cooperatively form a plurality of luminescent pixels that are electrically coupled to the metal lines through the power transmission lines; and
(f) when one of the luminescent pixels is defective, cutting one of the power transmission lines that is connected to the defective one of the luminescent pixels using an energy beam to electrically disconnect the electrode portion of the defective one of the luminescent pixels from the corresponding one of the metal lines.

2. The method as claimed in claim 1, wherein, in step (c), each of the electrode portions of the patterned first electrode layer is configured in a square shape and has a length ranging from 100 μm to 300 μm.

3. The method as claimed in claim 1, wherein, in step (a), the substrate has a first side portion, a second side portion that is opposite to the first side portion in the first direction, and a third side portion interconnecting the first and second side portions, a bus line being further formed on the third side portion of the substrate and extending in the first direction for interconnecting the metal lines.

4. The method as claimed in claim 1, wherein, in step (c), each of the transmission lines has a width in the second direction, the width being smaller than half of a length of the respective one of the electrode portions in the second direction.

5. The method as claimed in claim 1, wherein, in step (f), the energy beam is a laser beam.

6. The method as claimed in claim 1, wherein, in step (a), each of the metal lines is made of a metallic material selected from the group consisting of molybdenum, aluminum, titanium, tantalum, chromium, copper, silver, and combinations thereof.

7. The method as claimed in claim 1, wherein:
in step (a), each of the power transmission lines is made of a metallic material or a conductive metal oxide material;
the metallic material is selected from the group consisting of molybdenum, aluminum, titanium, tantalum, chromium, copper, silver, and combinations thereof; and
the conductive metal oxide material is selected from the group consisting of indium oxide, tin oxide, zinc oxide, indium tin oxide, indium zinc oxide, aluminum-doped zinc oxide, gallium-doped zinc oxide and combinations thereof.

8. The method as claimed in claim 1, wherein, in step (b), the patterned insulating layer has a transmission rate of greater than 80%.

9. The method as claimed in claim 1, wherein, in step (a), the transmission lines in each of the groups are spaced apart equidistantly in the second direction.

* * * * *